US 9,360,532 B2

(12) United States Patent
Kikuchi (10) Patent No.: US 9,360,532 B2
(45) Date of Patent: Jun. 7, 2016

(54) CURRENT DETECTION APPARATUS

(71) Applicant: DENSO CORPORATION, Kariya, Aichi-pref. (JP)

(72) Inventor: Tsukasa Kikuchi, Ama-gun (JP)

(73) Assignee: DENSO CORPORATION, Kariya (JP)

( * ) Notice: Subject to any disclaimer, the term of this patent is extended or adjusted under 35 U.S.C. 154(b) by 231 days.

(21) Appl. No.: 13/644,768

(22) Filed: Oct. 4, 2012

(65) Prior Publication Data

US 2013/0106449 A1  May 2, 2013

(30) Foreign Application Priority Data

Oct. 31, 2011 (JP) ................................. 2011-238471

(51) Int. Cl.
*G01R 27/08* (2006.01)
*G01R 31/36* (2006.01)
(Continued)

(52) U.S. Cl.
CPC ........... *G01R 31/3696* (2013.01); *H01M 10/48* (2013.01); *H01R 11/287* (2013.01)

(58) Field of Classification Search
CPC ............... G01R 31/3696; G01R 31/36; G01R 31/3606; G01R 31/3624; G01R 31/361; G01R 1/203; H01M 10/48; H01M 10/425; H01R 11/287; H01R 11/281; H01R 11/284; H01R 12/585; H01R 13/6683
USPC ......... 324/426, 713, 126, 522, 525, 544, 691, 324/76.11, 649, 600, 433; 439/754, 504, 439/522, 763, 762; 702/63, 64, 65, 57, 1; 320/105, 104; 361/748, 752, 753, 784, 361/796, 668, 616
See application file for complete search history.

(56) References Cited

U.S. PATENT DOCUMENTS

| 6,493,232 | B2 | 12/2002 | Skofljanec | |
| 7,245,497 | B2 * | 7/2007 | Klein et al. | ............ 361/752 |

(Continued)

FOREIGN PATENT DOCUMENTS

| JP | A-06-289059 | 10/1994 | |
| JP | A-2002-114112 | 4/2002 | |
| JP | 2008212187 | * 9/2008 | ............ A63F 7/02 |
| JP | A-2010-192135 | 9/2010 | |
| JP | A-2011-117853 | 6/2011 | |

OTHER PUBLICATIONS

English machine translation of Foreign Patent Document listed in line N above: JP 2008212187, Takeuchi Masahiro, Sep. 2008.*

(Continued)

*Primary Examiner* — Arleen M Vazquez
*Assistant Examiner* — Lee Rodak
(74) *Attorney, Agent, or Firm* — Oliff PLC (57) ABSTRACT

A current detection apparatus for detecting a current from a battery flowing through a harness. The apparatus includes a resistor having a current carrying member disposed between a terminal of the battery and the harness, a circuit board provided thereon with a current detection circuit for detecting a current flowing through the resistor, and a casing having a recessed portion for accommodating the circuit board, a cover for closing an opening of the recessed portion. The circuit board includes a solder junction between the circuit board and a terminal protruding from an inside bottom of the recessed portion and passing through a through hole arranged on the circuit board, and an open end of the recessed portion that can be engaged with the cover is non-parallel to the circuit board so that at least a portion of the circuit board including the solder junction lies outside of the recessed portion.

5 Claims, 8 Drawing Sheets

(51) Int. Cl.
*H01M 10/48* (2006.01)
*H01R 11/28* (2006.01)

(56) References Cited

U.S. PATENT DOCUMENTS

| | | | |
|---|---|---|---|
| 7,573,274 B2 * | 8/2009 | Aratani | 324/713 |
| 2002/0024800 A1 | 2/2002 | Skofljanec | |
| 2010/0019733 A1 * | 1/2010 | Rubio | 320/136 |
| 2010/0066351 A1 * | 3/2010 | Condamin et al. | 324/126 |

OTHER PUBLICATIONS

Jun. 3, 2014 Japanese Office Action issued in Application No. 2011-238471 with an English translation.

Mar. 24, 2015 Office Action issued in Japanese Patent Application No. 2011-238471.

Oct. 14, 2014 Office Action issued in Japanese Application No. 2011-238471 (with English-language translation).

* cited by examiner

CURRENT DETECTION APPARATUS

CROSS-REFERENCE TO RELATED APPLICATION

This application is based on and claims the benefit of priority from earlier Japanese Patent Application No. 2011-238471 filed Oct. 31, 2011, the description of which is incorporated herein by reference.

BACKGROUND

1. Technical Field

The present invention relates to a current detection apparatus mounted in a vehicle, such as a passenger car or a truck, for detecting a charge or discharge current of a battery.

2. Related Art

A known current detection apparatus, as disclosed in Japanese Patent No. 2704483, includes a circuit board (in the form of a printed-circuit board) provided with an electronic circuit thereon, and a casing accommodating the circuit board therein with a cover closing an opening of the casing to form an enclosure. In this current detection apparatus, each of a plurality of contact pins protruding from an inside surface of the casing and passing through a respectively corresponding through-hole arranged on the circuit board is soldered to a wiring on the circuit board to establish electrical connection between the contact pin and the wiring.

In soldering, which provides preferable electrical connection between each contact pin and the circuit board, the through-hole is fully filled with solder and a solder fillet covers the whole land on a rear-side surface opposite to an front-side surface (as a soldering surface) of the circuit board, resulting from a solder-rising phenomenon in which the solder rises along the through-hole from the front-side surface to the rear-side surface of the circuit board.

Unsuitable selection of a soldering condition or a flux material may lead to poor solder rise, i.e., less than 100% solder fill, as a kind of soldering failure. In the case of poor solder rise, a shortage of solder junction area may reduce thermal fatigue resistance and mechanical fatigue strength under heavy vibration at the solder junction. Hence, a soldered condition of the solder junction is of importance with respect to quality aspect of a product, i.e., a current detection apparatus. A decision as to whether each product is good or bad is made commonly by performing appearance (or visual) inspection for soldering failure after soldering.

In the disclosed apparatus, however, the circuit board lies lower than the level of a cover-mounting surface of the casing, and a clearance between the circuit board and an inside wall of the casing is small. This prevents the solder rise from being inspected visibly from the rear-side of the circuit board opposite to the front-side (on which side the cover is secured to the casing) after soldering. As an exemplary solution, a circuit-board receiver (corresponding to the element 11b in FIG. 2 of Japanese Patent No. 2704483) protruding from an inside bottom of the casing may be raised so that the circuit board mounted thereon lies higher than the level of the cover-mounting surface, thereby enabling appearance checking for soldering failure. This solution, however, leads to an increase in product size. In addition, in the recent automotive field, a larger interior space of a vehicle is ensured by downsizing an engine compartment, and the engine compartment is over-crowded by an increasing number of electronic devices for ensuring safety of the user. Therefore, the increase in product size, which may reduce mountability in the engine compartment and maintainability of the vehicle, is not desirable.

In consideration of the foregoing, it would therefore be desirable to have a current detection apparatus for enabling appearance inspection for soldering failure, such as poor solder rise, without increasing a product size.

SUMMARY

In accordance with an exemplary embodiment of the present invention, there is provided a current detection apparatus for detecting a current from a battery flowing through a harness. The apparatus includes: a resistor having a current carrying member disposed between a terminal of the battery and the harness to provide a current carrying path therebetween; a circuit board provided thereon with a current detection circuit for detecting a current flowing through the resistor on the basis of a potential difference between two positions along the current carrying member; and a casing having a recessed portion for accommodating therein the circuit board; a cover for closing an opening of the recessed portion of the casing to form an enclosure. In the apparatus, the circuit board includes a solder junction between the circuit board and a terminal protruding from an inside bottom of the recessed portion and passing through a through hole arranged on the circuit board, and an open end of the recessed portion that can be engaged or mate with the cover is non-parallel to the circuit board so that at least a portion of the circuit board including the solder junction lies outside of the recessed portion.

According to the embodiment, the open end of the recessed portion of the casing that can be engaged with the cover (also referred to as an engagement section of the recessed portion) is non-parallel to the circuit board so that the upper end portion of the circuit board including the solder junction lies outside of the recessed portion, thereby allowing a soldered condition of the solder junction to be determined visibly with ease. In addition, only the portion of the circuit board including the solder junction is allowed to lie outside of the recessed portion of the casing and the whole circuit board doesn't have to be raised above the level of the open end of the recessed portion of the casing when mounted on the battery, thus preventing an increase in product size.

DESCRIPTION OF SPECIFIC EMBODIMENTS

The present inventions will be described more fully hereinafter with reference to the accompanying drawings. Like numbers refer to like elements throughout.

Figure 1:
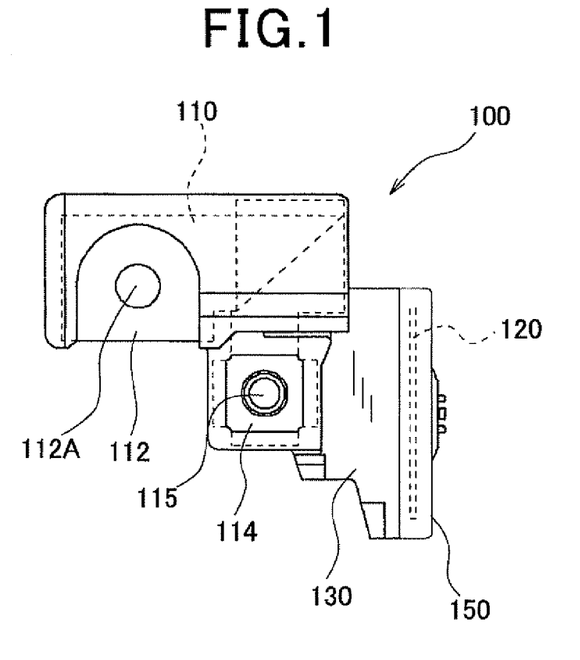
FIG. 1 is a top view of a current detection apparatus in accordance with one embodiment of the present invention.
Figure 2:
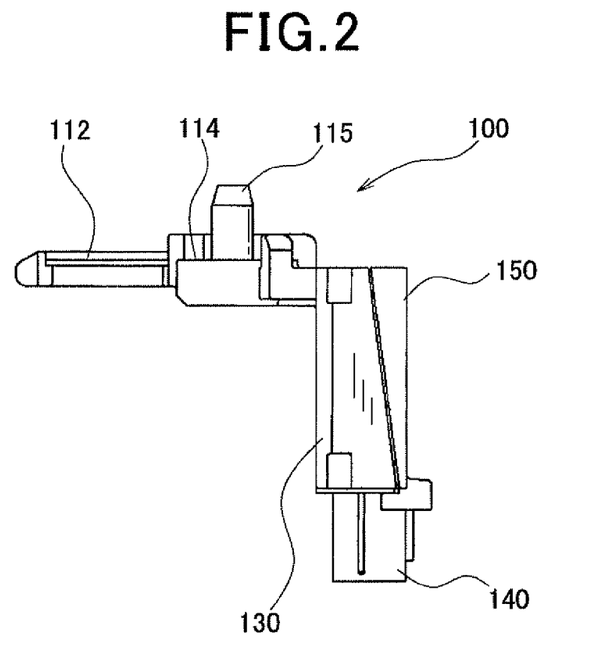
FIG. 2 is a side view of the current detection apparatus.
Figure 3:
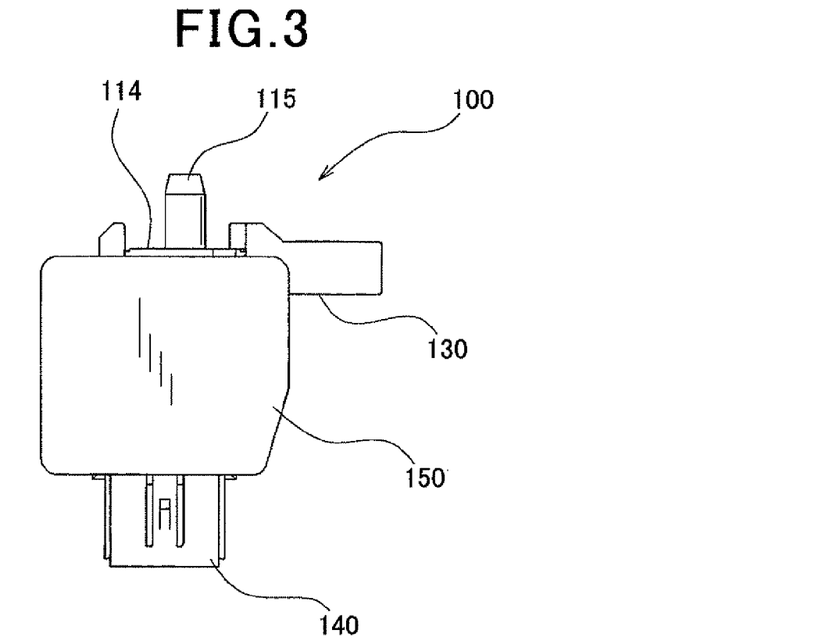
FIG. 3 is a side view of the current detection apparatus.

FIG. 1 is a top view of a current detection apparatus in accordance with one embodiment of the present invention. FIG. 2 is a side view of the current detection apparatus, taken from below FIG. 1. FIG. 3 is a side view of the current detection apparatus, taken from right of FIG. 1.

The current detection apparatus 100 of the present embodiment includes a bus bar 110 serving as a resistor (referred to as a shunt resistor) formed from a conductive material, a circuit board 120 provided thereon with a current detection circuit that detects a current flowing through the bus bar 110 on the basis of a potential difference between two positions along a current carrying path of the bus bar 110, a casing 130 housing the bus bar 110 and the circuit board 120, a connector 140 having a plurality of connector terminals exposed to the interior thereof for enabling electrical connection to the circuit board 120, and a cover 150 that closes an opening of a recessed portion of the casing 130 accommodating therein the circuit board 120.

The bus bar 110 has a twice-folded configuration within the casing 130, and includes a first fixed portion 112 at one end, which is secured and electrically connected to a battery-side wiring, and a second fixed portion 114 at the other end, which is secured and electrically connected to a harness 300. An upper surface of the first fixed portion 112 is coplanar with an upper surface of the second fixed portion 114. That is, the upper surface of the first fixed portion 112 is at the same level as the upper surface of the second fixed portion 114.

Figure 4:
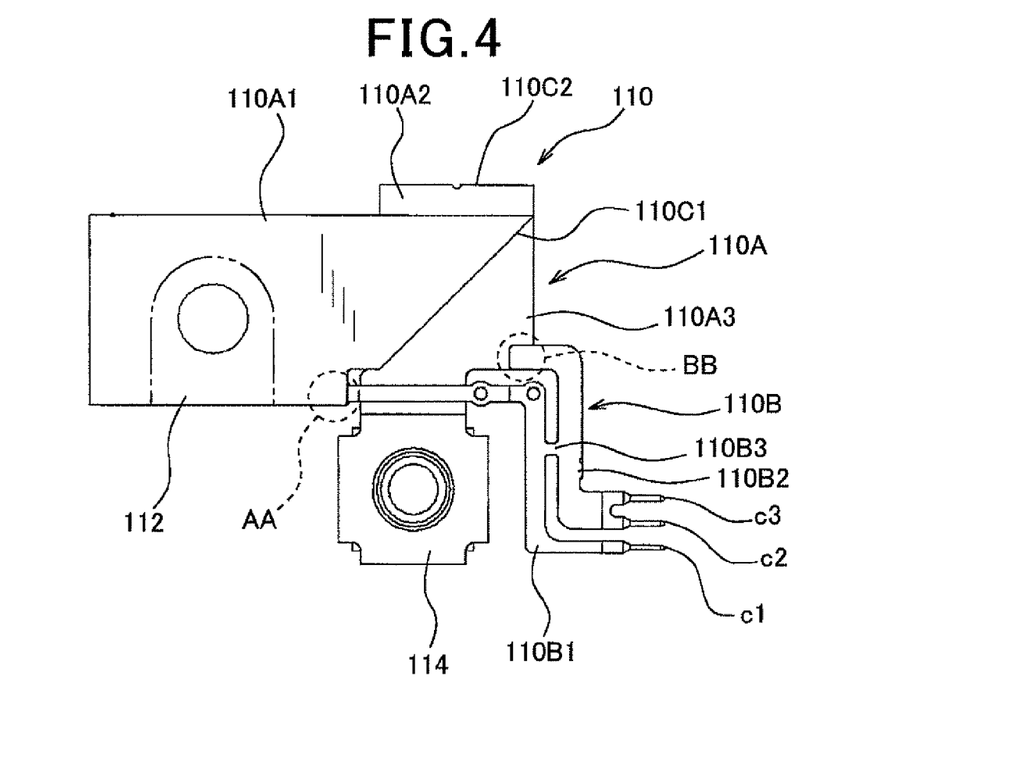
FIG. 4 is an expanded view of a bus bar of the current detection apparatus.
Figure 5:
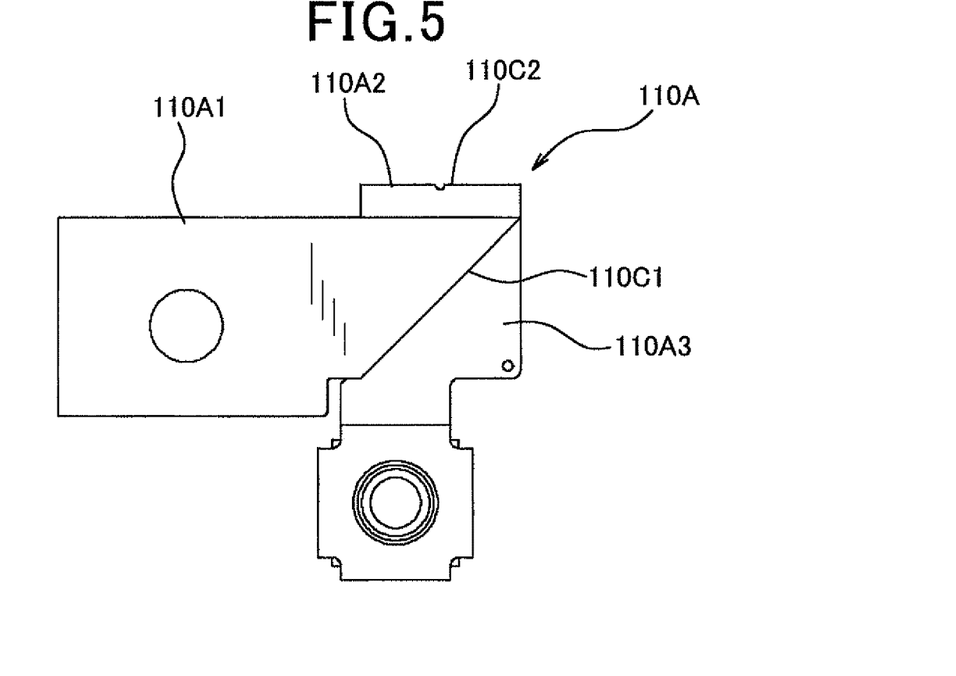
FIG. 5 is a top view of a current carrying member of the current detection apparatus.
Figure 6:
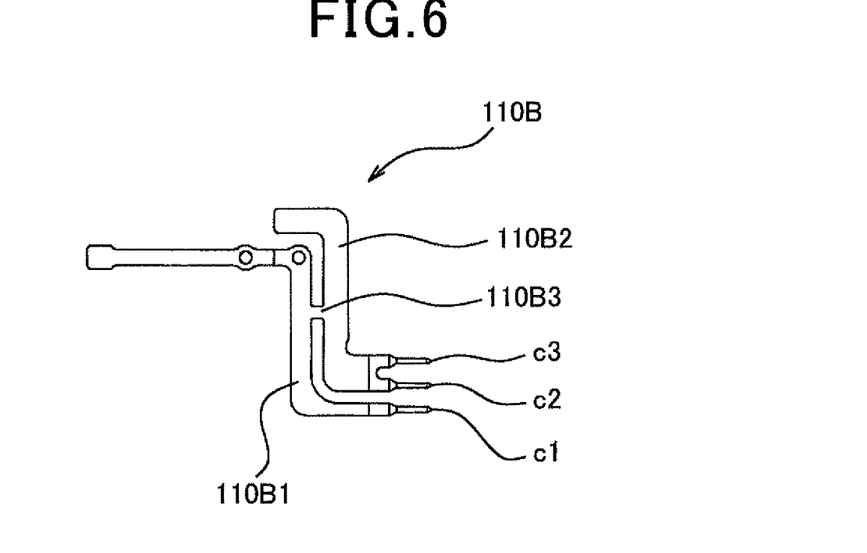
FIG. 6 is a top view of a lead member of the current detection apparatus.
Figure 7:
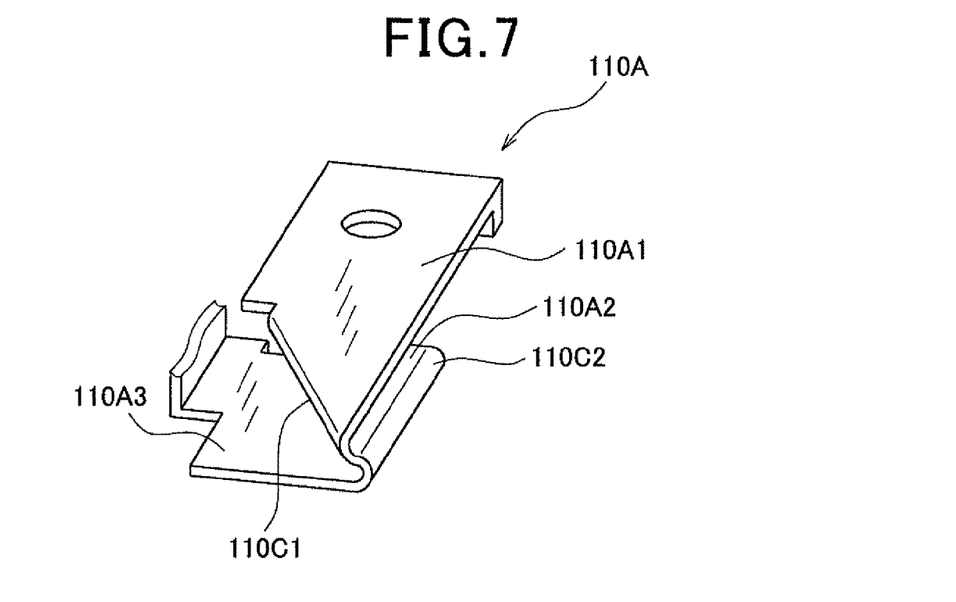
FIG. 7 is a perspective view of the current carrying member of the current detection apparatus.

FIG. 4 is an expanded view of the bus bar 110, where only the bus bar 110 is depicted for illustration purposes only. The bus bar 110 includes a current carrying member 110A through which a current flows between the first fixed portion 112 and the second fixed portion 114, and a lead member 110B via which a potential difference between two positions along the current carrying member 110A is acquired by the current detection circuit. FIG. 5 is a top view of the current carrying member 110A. FIG. 6 is a top view of the lead member 110B. FIG. 7 is a partial perspective view of the current carrying member 110A. In the present embodiment, the first fixed portion 112, the second fixed portion 114, and the current carrying member 110A are disposed on a top surface of the battery 200. The circuit board 120 is disposed on a side of the battery 200. The current carrying member 110A and the circuit board 120 are electrically connected to each other through the lead member 110B.

To define the current carrying member 110A, a straight elongated rectangular plate is folded twice in a direction perpendicular to the top surface of the battery 200. More specifically, the current carrying member 110A includes a first conductor panel 110A1 connected to the first fixed portion 112 and having a first fold 110C1 at one end, a second conductor panel 110A2 having one end joined with the first conductor panel 110A1 at the first fold 110C1 and an opposite end at a second fold 110C2, and a third conductor panel 110A3 having one end joined with the second conductor panel 110A2 at the second fold 110C2 and connected to the second fixed portion 114. Preferably, the extension direction of the first conductor panel 110A1 and the extension direction of the second conductor panel 110A2 are inclined at a first specific angle (90 degrees in the present embodiment as shown in FIG. 4) to each other. The extension direction of the second conductor panel 110A2 and the extension direction of the third conductor panel 110A3 are inclined at a second specific angle (180 degrees in the present embodiment as shown in FIG. 4) to each other.

The lead member 110B is used to electrically connect the current carrying member 110A and the circuit board 120. The current carrying member 110A and the lead member 110B are separate members, (as shown in FIGS. 5, 6). The lead member 110B is welded to the current carrying member 110A for establishing electrical and mechanical connection therebetween. As shown in FIG. 6, the lead member 110B includes a first lead conductor 110B1 and a second lead conductor 110B2 jointed together through a joining portion 110B3. The first lead conductor 110B1 and the second lead conductor 110B2 of the lead member 110B are kept joined together until welding of the lead member 110B to the current carrying member 110A is completed. The joining portion 110B3 is removed to disconnect the first lead conductor 110B1 and the second lead conductor 110B2 after completion of the welding.

One end of the first lead conductor 110B1 is welded to a lower-side surface of the first conductor panel 110A1 at a corner AA. One end of the second lead conductor 110B2 is welded to an upper-side surface of the third conductor panel 110A3 at a corner BB.

The first and second lead conductors 110B1, 110B2 extend from the corners AA, BB, respectively, toward a side of the battery 200 on which the circuit board 120 is mounted (hereinafter referred to as a board-mounting side of the battery 200). The first and second lead conductors 110B1, 110B2 further extend along the top surface of the battery 200 and in parallel with the board-mounting side of the battery 200, and still further extend in the same direction as their end portions at the respective corners AA, BB. It is possible to vary a length of each of the portions of the first and second lead conductors 110B1, 110B2 that extend along the top surface of the battery 200 and in parallel with the board-mounting side of the battery 200. This allows the casing 130 accommodating the circuit board 120 therein to be displaced laterally along the board-mounting side of the battery 200 without changing the positions of the corners AA, BB welded to the first and second lead conductors 110B1, 110B2, respectively. Therefore, a relationship between a current value and a potential difference between the corners AA, BB will not be affected by changing the above length, and no redesign of the current detection circuit will thus be required.

Figure 8:
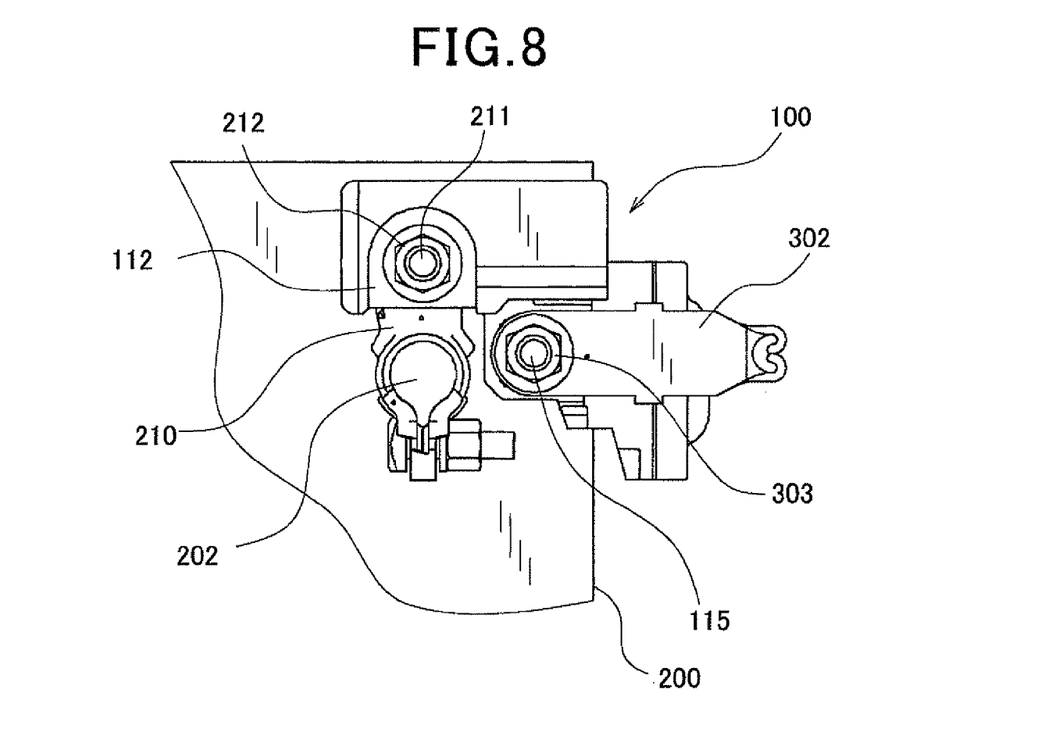
FIG. 8 is a top view illustrating a positional relationship between the current detection apparatus and a battery.
Figures 9, 10:
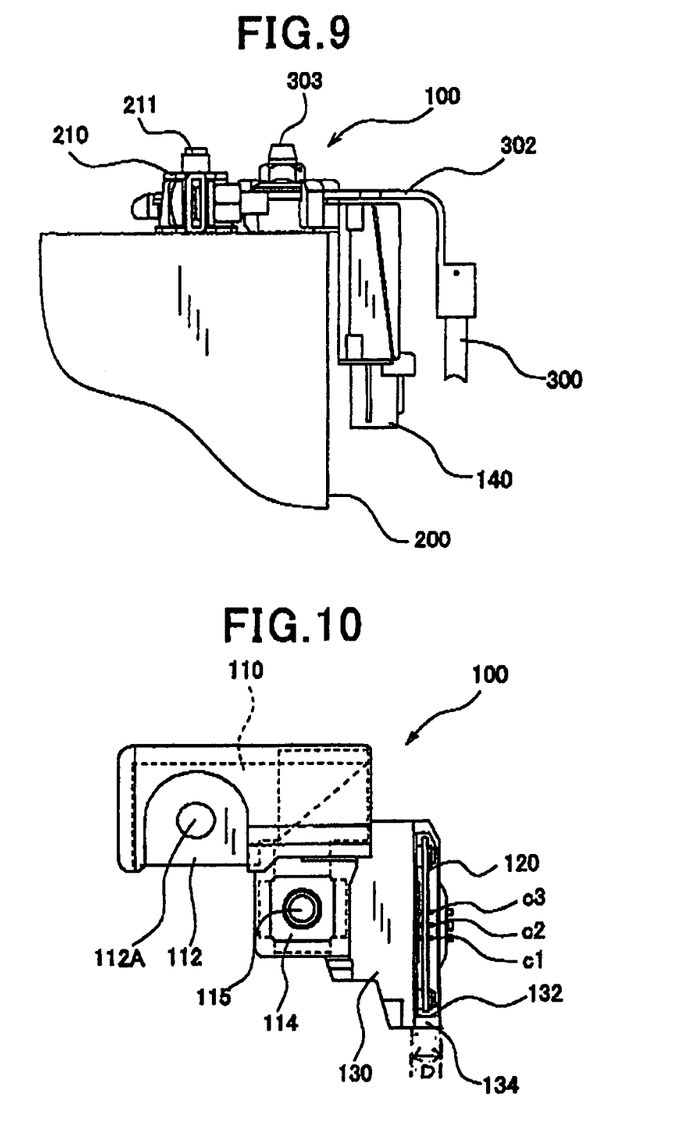
FIG. 9 is a side view illustrating a positional relationship between the current detection apparatus and the battery.
FIG. 10 is a top view of the current detection apparatus.

FIG. 8 is a top view illustrating a positional relationship between the current detection apparatus 100 and the battery 200, where the current detection apparatus 100 is mounted on the battery 200 and the harness 300 is secured to the battery 200 via its terminal 302. FIG. 9 is a side view illustrating a positional relationship between the current detection apparatus 100 and the battery 200. As shown in FIG. 8 and FIG. 9, the current detection apparatus 100 is secured and electrically connected to a negative terminal 202 of the battery 200 through a mounting bracket 210 (as a battery-side wiring) which serves as a wiring between the negative terminal 202 of the battery 200 and the first fixed portion 112, and a bolt 211 protrudes upwardly from an end portion of the mounting bracket 210. In the present embodiment, the bolt 211 passes through a first through hole 112A (shown in FIG. 1) arranged on the first fixed portion 112 and cooperates with a nut 212 to bring out the clamping action.

A second through hole is arranged on the second fixed portion 114, and a bolt 115 passes through this through hole. In addition, a third through hole is arranged on the terminal 302 of the harness 300. The bolt 115 further passes through the third through hole and cooperates with a nut 303 to bring out the clamping action, thereby securing and electrically connecting the terminal 302 of the harness 300 to the second fixed portion 114.

In the present embodiment, the casing 130 is formed of a resin material that has high thermal conductivity and electrical insulating ability, such as a polyphenylene sulfide (PPS) resin, and the whole bus bar 110, save for the first and second fixed portions 112, 114 exposed to the exterior, is insert-molded.

As described above, the bus bar 110 has a twice-folded, complicated configuration, and the two lead conductors 110B1, 110B2 for detecting a potential difference between the two spaced-apart corners AA, BB extend therefrom to the circuit board 120. The lead conductor 110B1 has a current detection terminal C1 at its end. The lead conductor 110B2 has two equal branches at its end. One branch is used as a sensing-dedicated ground terminal C2 and the other branch is used as a circuit-dedicated ground terminal C3. The circuit-dedicated ground terminal C3 is provided to minimize variations in electrical potential at the sensing-dedicated ground terminal C2 caused by operations of various circuits mounted on the circuit board 120. In the case of small variations in electrical potential at the sensing-dedicated ground terminal C2, the circuit-dedicated ground terminal C3 may be removed. Each of these three terminals (the current detection terminal C1, the sensing-dedicated ground terminal C2, the circuit-dedicated ground terminal C3) extending from the bus bar 110 passes through a respectively corresponding through hole arranged on the circuit board 120 and is soldered to the circuit board 120 so as to be electrically connected to the current detection circuit on the circuit board 120.

In general, the bus bar 110 through which a large current flows from the battery 200 has a significant heat capacity. Accordingly, when the three ends C1 to C3 of the lead member 110B extending from the current carrying member 110A are used to solder the bus bar 110 to the current detection circuit, insufficient heating may result in a soldering failure, such as poor solder rise. To facilitate inspection for such a soldering failure, it is desired that a soldered condition can be determined visually.

Figure 11:
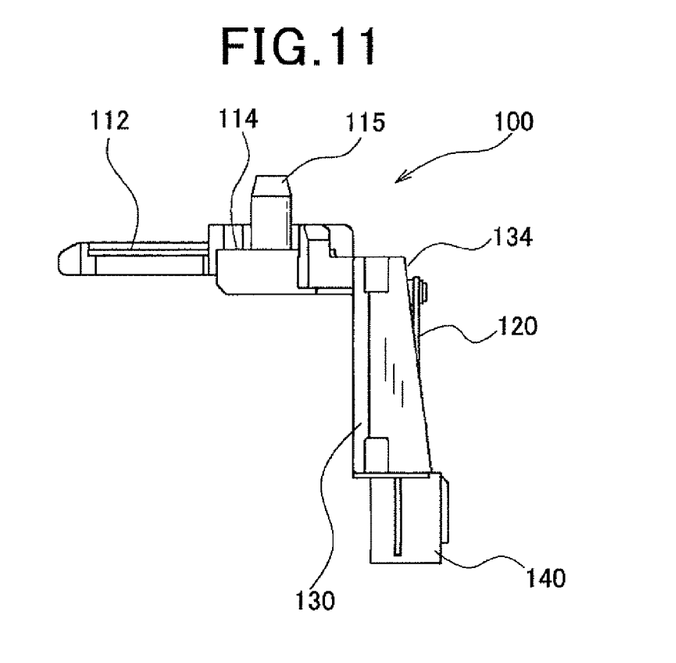
FIG. 11 is a side view of the current detection apparatus.
Figure 12A:
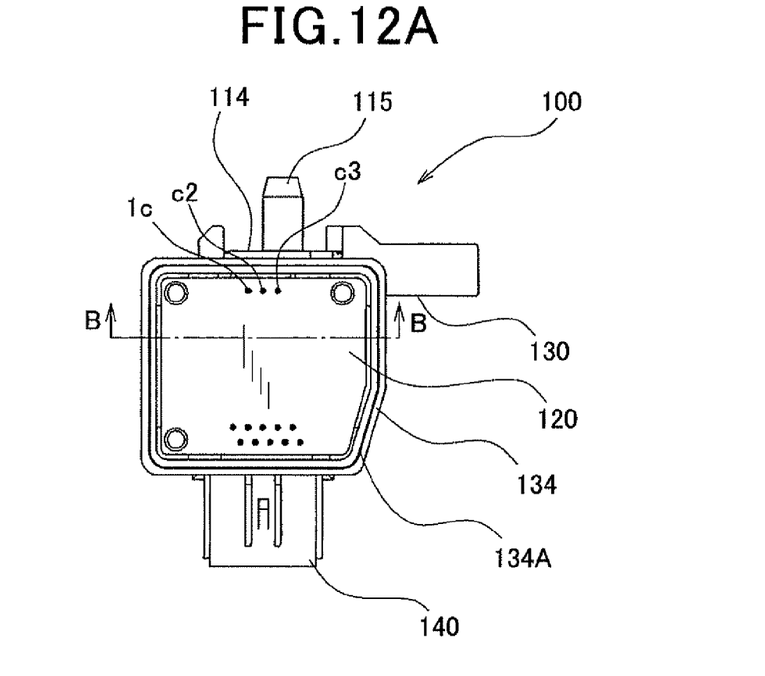
FIG. 12A is a side view of the current detection apparatus.

FIG. 10 is a top view of the current detection apparatus 100 with the cover 150 removed. FIG. 11 is a side view of the current detection apparatus 100, taken from below of FIG. 10. FIG. 12A is a side view of the current detection apparatus 100, taken from right of FIG. 10.

As shown in FIG. 10, the three terminals (the current detection terminal C1, the sensing-dedicated ground terminal C2, and the circuit-dedicated ground terminal C3) extending from the current carrying member 110A of the bus bar 110 protrude from an inside bottom of the recessed portion 132 of the casing 130. The recessed portion 132 accommodates the circuit board 120 therein. Each of these three terminals passes through a respectively corresponding through hole arranged on the circuit board 120 and is soldered to the circuit board via the extremity of the terminal. The terminals C1 to C3 are positioned proximate one end of the circuit board 120 (proximate an upper end of the circuit board 120 as in FIG. 12A in the present embodiment).

An open end 134 of the recessed portion 132 that can be engaged with the cover 150 (hereinafter also referred to as an engagement section of the recessed portion 132) is lying in an imaginary plane that is non-parallel to the circuit board 120, i.e., the front-side or rear-side surface of the circuit board 120. More specifically, as shown in FIG. 11, the plane is tilted relative to the circuit board 120 so that a depth D of the recessed portion 132 (a width of a side wall of the recessed portion 132 as shown in FIG. 10) decreases monotonically in an upward direction of the casing 130 with the depth D being kept constant in a lateral direction of the casing 130 so that an upper end portion of the circuit board 120 including three solder junctions, each of which is a solder junction between the circuit board 120 and one of the three terminals C1 to C3, lies outside of the recessed portion 132. That is, both the front-side and rear-side surfaces of the upper end portion of the circuit board 120 are visible from the exterior when the cover 150 is removed. This configuration allows a soldered condition of each of the three solder junctions to be readily determined visibly from both sides of the circuit board 120.

Figure 12B:
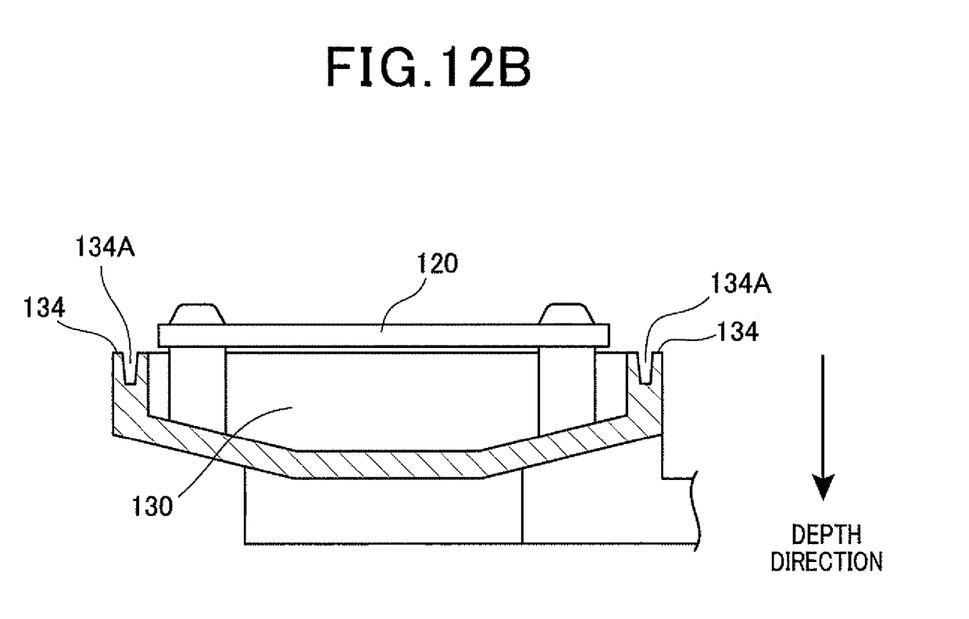
FIG. 12B is a partial cross-sectional view of FIG. 12A along line B-B.
Figure 12C:
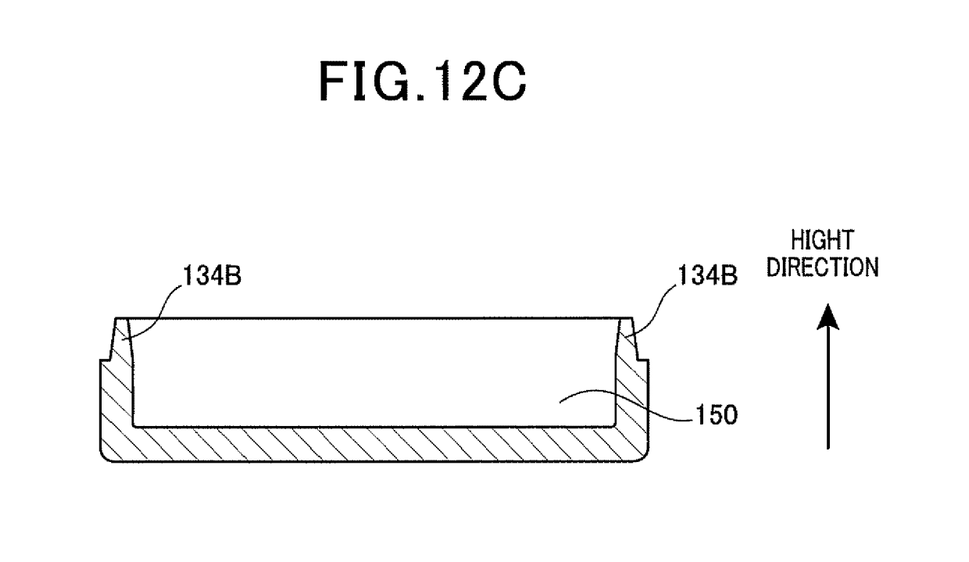
FIG. 12C is a cross-sectional view of a cover that can be engaged with the casing of FIG. 12B.

In addition, as shown in FIG. 12A, the engagement section 134 includes a groove 134A surrounding the opening of the recessed portion 132, a depth direction of which is perpendicular to the plane as can be seen in FIG. 12B, and the cover 150 includes a protrusion 134B at its open end 135 as shown in FIG. 12C, which is arranged on the cover 150 so as to be circumferentially engaged with the groove 134A so that the opening of the recessed portion 132 can be closed by the cover 150 to form an enclosure. At the time of assembling the cover 150 with the casing 130, the cover 150 is adhered to the casing 130 by applying adhesive to the groove 134A with the engagement section 134 kept horizontal by inclining the current detection apparatus 100 accordingly. Alternatively, the engagement section 134 may include a protrusion surrounding the opening of the recessed portion 132 and the cover 150 may include a groove arranged at the open end of the cover 150 to be circumferentially engaged with the protrusion of the recessed portion 132 so that the opening of the recessed portion 132 can be closed by the cover 150 to form an enclosure. Still alternatively, the cover 150 may be adhered to the casing 130 using neither the groove nor the protrusion.

Figure 13:
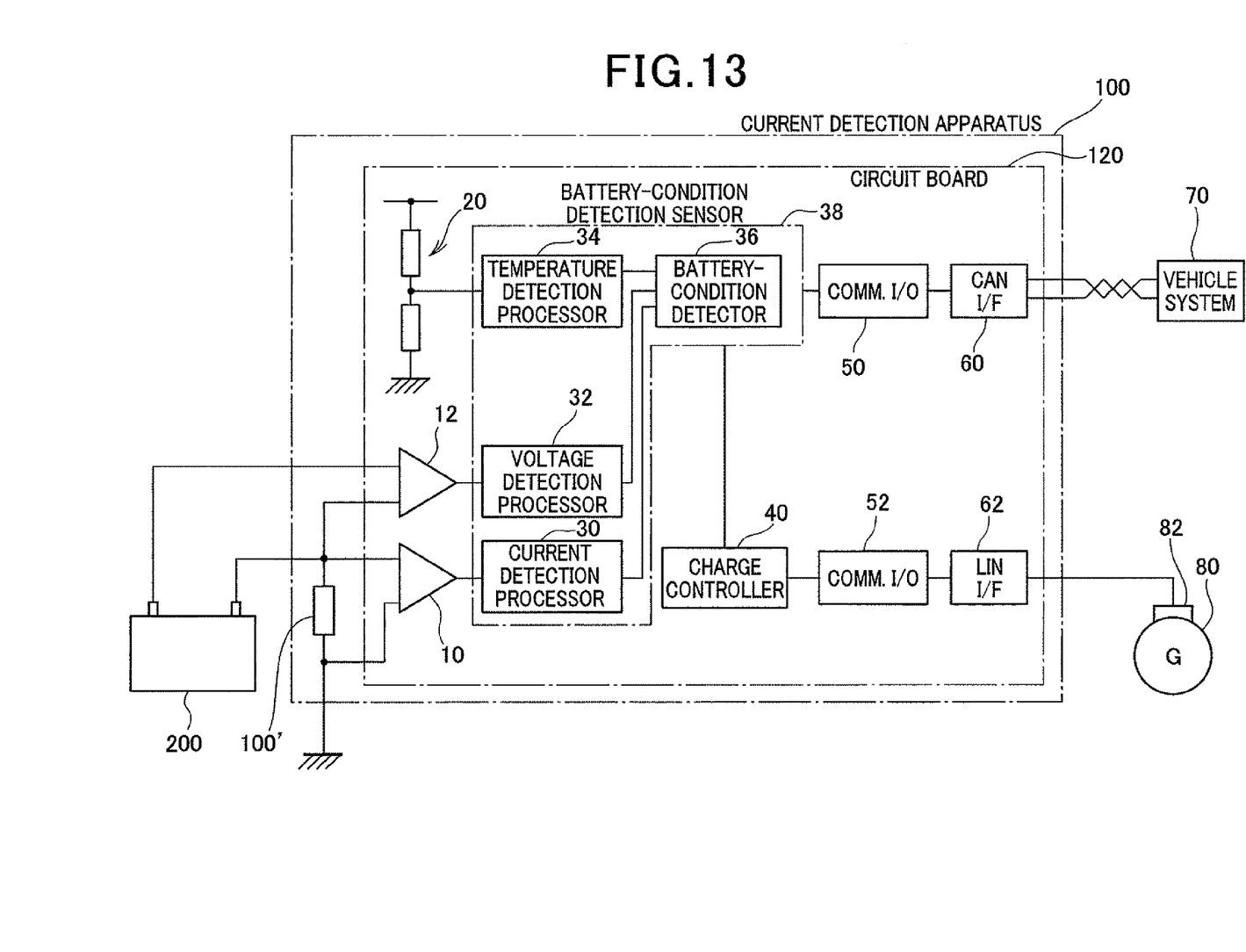
FIG. 13 is a block diagram of the current detection apparatus and the battery electrically connected thereto.

FIG. 13 is an exemplary block diagram of the current detection apparatus 100 and the battery 200 electrically connected thereto. As shown in FIG. 13, the circuit board 120 of the current detection apparatus 100 includes a differential amplifier 10 electrically connected across a shunt resistor 100' that is a portion of the bus bar 110, a differential amplifier 12 electrically connected between positive and negative terminals of the battery 200, a temperature detector 20, a current detection processor 30, a voltage detection processor 32, a temperature detection processor 34, a battery-condition detector 36, a charge controller 40, a communication input/output unit (communication I/O) 50, 52, a CAN-interface (CAN I/F) 60 that transmits and receives data according to the CAN protocol, a LIN-interface (LIN I/F) 62 that transmits and receives data according to the LIN protocol. The differential amplifier 10 amplifies a voltage across the shunt resistor 100', and the current detection processor 30 detects a current flowing through the shunt resistor 100' on the basis of an output voltage of the differential amplifier 10. The current detection circuit includes the differential amplifier 10 and the current detection processor 30. The differential amplifier 12 converts a voltage across the battery 200 (referred to as a battery voltage) into a proper level of voltage, and the voltage detection processor 32 detects the battery voltage on the basis of an output voltage of the differential amplifier 12. The temperature detector 20 includes a voltage-dividing circuit formed of a resistor and a thermistor, where a resistance value of the thermistor varies as a function of a temperature and a divided voltage of the voltage-dividing circuit varies accordingly. The temperature detection processor 34 detects a temperature of the current detection apparatus 100 (i.e., a temperature of the battery 200) on the basis of an output voltage (a divided voltage) of the temperature detector 20. The battery-condition detector 36 generates a battery condition signal on the basis of a detection value of each of the current detection processor 30, the voltage detection processor 32, the temperature detection processor 34. A battery-condition detection sensor 38 includes the current detection processor 30, the voltage detection processor 32, the temperature detection processor 34, the battery-condition detector 36. The charge controller 40 controls a power generation state of a vehicle generator (G) 80 on the basis of the battery condition signal generated by the battery-condition detector 36. The power generation control is performed by transmitting an instruction to a power-generation controller 82 mounted on the vehicle generator 80 via the communication input/output unit 52 and the LIN-interface 62. The battery condition signal generated by the battery-condition detector 36 is transmitted to the vehicle system 70 via the communication input/output unit 50 and the CAN-interface 60. The vehicle system 70 integrally controls an engine and various electrical loads on the basis of the received battery condition signal and the like.

As described above, in the current detection apparatus 100 of the present embodiment, the open end 134 of the recessed portion 132 that can be engaged with the cover 150 (i.e., the engagement section of the recessed portion 132) is tilted relative to the front-side or rear-side surface of the circuit board 120 so that the upper end portion of the circuit board 120 including the three solder junctions, each of which is a solder junction between the circuit board 120 and one of the three terminals C1 to C3, lies outside of the recessed portion 132, which facilitates visible determination of a soldered condition of each of the three solder junctions from both the outer and inner sides of the circuit board 120. In addition, only the upper end portion of the circuit board 120 including the three solder junctions is allowed to lie outside of the recessed portion 132 of the casing 130 and the circuit board 120 doesn't have to be raised above the level of the cover-mounting surface of the casing, which can prevent an increase in product size.

In addition, in the above described embodiment, the open end (i.e., the engagement section) 134 of the recessed portion 132 that can be engaged with the cover 150 lies in a single plane. That is, the engagement section 134 of the recessed portion 132 is coplanar. This enables leveling of the whole engagement section 134 when the cover 150 is assembled with the casing 130, thereby facilitating assembling of the cover 150 with the casing 130.

In addition, in the above described embodiment, the open end (i.e., the engagement section) 134 of the recessed portion 132 that can be engaged with the cover 150 includes the groove 134A surrounding the opening of the recessed portion 132, the depth direction of which is perpendicular to the plane in which the engagement section of the recessed portion 132 is lying. On the other hand, the cover 150 includes the protrusion 134B arranged on the cover 150 to be circumferentially engaged with the groove 134A so that the opening of the recessed portion 132 can be closed by the cover 150 to form an enclosure. The engagement section 134 of the recessed portion 132 is allowed to be kept horizontal when the cover 150 is adhered to the casing 130, which enables uniform application of adhesive to the groove 134A and thus enhances reliability of adhesion of the cover 150 to the casing 130.

In addition, in the above described embodiment, the bus bar 110 through which a large current flows from the battery 200 has a significant heat capacity. Accordingly, when the three terminals C1 to C3 of the lead member 110B extending from the current carrying member 110A of the bus bar 110 are used to solder the bus bar 110 to the circuit board 120, a soldering failure, such as poor solder rise, is likely to occur.

The current detection apparatus 100 of the above described embodiment can facilitate visible inspection for soldering failure and can thus reliably prevent the soldering failure from occurring.

In addition, in the above described embodiment, the three solder junctions, each of which is a solder junction between the circuit board 120 and one of the current detection terminal C1, the sensing-dedicated ground terminal C2, and the circuit-dedicated ground terminal C3, are arranged on the upper end portion of the circuit board 120 that lies outside of the recessed portion 132 of the casing 130. This can prevent a soldering failure at each solder junction from being missed when visibly inspected.

There will now be explained some modifications of the above described embodiment that may be devised without departing from the spirit and scope of the present invention. In the above described embodiment, the bus bar 110 serves as the shunt resistor. Alternatively, the bus bar 110 and the shunt resistor are separate members.

In the above described embodiment, the current detection apparatus 100 is secured and electrically connected to the negative terminal 202 of the battery 200 through the mounting bracket 210. Alternatively, the current detection apparatus 100 may be secured directly to the negative terminal 202 of the battery 200 by deforming the first fixed portion 112 so as to extend to the negative terminal 202.

In the above described embodiment, the current carrying member 110A of the bus bar 110 has the twice-folded configuration, which is formed by folding a straight elongated rectangular plate twice. Alternatively, the current carrying member 110A of the bus bar 110 may be formed by folding a straight elongated rectangular plate once or more than twice or by folding a non-straight elongated plate once or more or without folding the plate.

Applicability

As described above, according to the present invention, the open end (i.e., the engagement section) 134 of the recessed portion 132 that can be engaged with the cover 150 is tilted relative to the circuit board 120 so that the upper end portion of the circuit board 120 including the three solder junctions, each of which is a solder junction between the circuit board 120 and one of the three terminals C1 to C3, lies outside of the recessed portion 132, thereby allowing a soldered condition of each of the three solder junctions to be readily, visibly determined from both the outer and inner sides of the circuit board 120.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A current detection apparatus for detecting a current from a battery flowing through a harness, comprising:
   a resistor having a current carrying member disposed between a terminal of the battery and the harness to provide a current carrying path therebetween;
   a circuit board provided thereon with a current detection circuit for detecting a current flowing through the current carrying member on the basis of a potential difference between two positions along the current carrying member; and a casing having a recessed portion for accommodating therein the circuit board;

a cover for closing the recessed portion of the casing to form an enclosure;

wherein the circuit board includes solder junctions between the circuit board and respective terminals of a plurality of terminals protruding from an inside bottom of the recessed portion and passing through respective through holes arranged on the circuit board, one of the plurality of terminals being electrically connected to the current carrying member at one of the two positions along the current carrying member, another one of the plurality of terminals being electrically connected to the current carrying member at the other of the two positions along the current carrying member, and an open end of the recessed portion that is engaged with the cover lies in a single pane tilted relative to the circuit board so that a portion of the circuit board that includes the solder junctions lies completely outside the recessed portion.

2. The apparatus of claim 1, wherein the open end of the recessed portion that is engaged with the cover comprises a groove surrounding the recessed portion, a depth direction of the groove being perpendicular to the plane, and the cover comprises a protrusion arranged on the cover to be circumferentially engaged with the groove so that the recessed portion is closed by the cover to form an enclosure.

3. The apparatus of claim 1, wherein the open end of the recessed portion that is engaged with the cover comprises a protrusion surrounding the recessed portion, a height direction of the protrusion being perpendicular to the plane, and the cover comprises a groove arranged on the cover to be circumferentially engaged with the protrusion so that the recessed portion is closed by the cover to form an enclosure.

4. The apparatus of claim 1, wherein the solder junctions are positioned in one end portion of the circuit board that lies completely outside the recessed portion.

5. The apparatus of claim 1, wherein the circuit board is disposed and vertically oriented on a side of the battery and the current carrying member is disposed on a top surface of the battery, and the solder junctions are positioned in a top end portion of the circuit board that lies completely outside the recessed portion.

* * * * *